United States Patent [19]

McDavid

[11] Patent Number: 4,507,853
[45] Date of Patent: Apr. 2, 1985

[54] METALLIZATION PROCESS FOR INTEGRATED CIRCUITS

[75] Inventor: James M. McDavid, Houston, Tex.

[73] Assignee: Texas Instruments Incorporated, Dallas, Tex.

[21] Appl. No.: 410,755

[22] Filed: Aug. 23, 1982

[51] Int. Cl.³ .................................. H01L 21/285
[52] U.S. Cl. ........................... 29/591; 29/577 C; 357/68; 357/71; 156/643
[58] Field of Search ............... 29/571, 577 C, 591; 357/68, 71; 156/643

[56] References Cited

U.S. PATENT DOCUMENTS

| 4,291,322 | 9/1981 | Clemens et al. | 357/23 |
| 4,392,298 | 7/1983 | Barker | 29/577 C |

Primary Examiner—Brian E. Hearn
Assistant Examiner—Alan E. Schiavelli
Attorney, Agent, or Firm—John G. Graham

[57] ABSTRACT

Metal contacts and interconnections for semiconductor integrated circuits are formed by a process of two metal depositions to increase step or sidewall coverage. After a first layer of metal is deposited, a preferential etch removes all of the metal except on the vertical sides of steps or apertures. A second layer of metal is deposited over the remaining parts of the first, resulting in smoother transistions and greater thickness at steps.

10 Claims, 6 Drawing Figures

METALLIZATION PROCESS FOR INTEGRATED CIRCUITS

BACKGROUND OF THE INVENTION

This invention relates to semiconductor devices, and more particularly to metal contacts and interconnections for semiconductor integrated circuits.

In manufacture of VLSI semiconductor devices, a thin metal coating such as aluminum is deposited and patterned to create contacts and interconnections. Problems occur in thinning of the metal at near-vertical sidewalls of holes in thick insulator layers where the metallization pattern makes contact to silicon regions or to polysilicon layers. Thinner metal at these sidewalls or other steps results in higher resistance and a propensity for electro-migration failures. Heretofore, the steepness of the sidewalls has been minimized by a "reflow" process but this necessitates undesirable high temperature operations and larger geometries.

It is the principal object of this invention to provide an improved process for making metal contacts and interconnections for semiconductor integrated circuits. Another object is to provide improved semiconductor devices with metallization patterns avoiding thinning at steps and contact apertures. A further object is to provide improved step coverage and lower resistance for metallization of semiconductor devices.

SUMMARY OF THE INVENTION

In accordance with one embodiment of the invention, metal contacts and interconections for semiconductor integrated circuits are formed by a process of two metal depositions to increase step or sidewall coverage. After a first layer of metal is deposited, a preferential etch removes all of the metal except on the vertical sides of steps or apertures. A second layer of metal is deposited over the remaining parts of the first, resulting in smoother transistions and greater thickness at steps.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
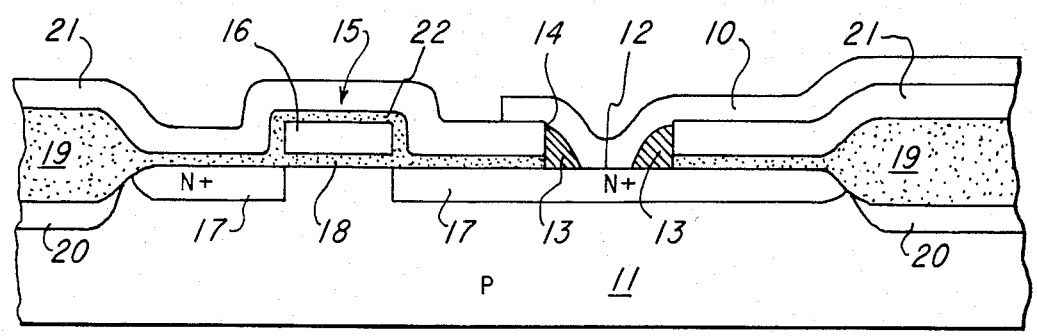
FIG. 1 is a greatly enlarged elevation view in section of a small part of a semiconductor chip having metal contacts made according to the invention.
Figure 2:
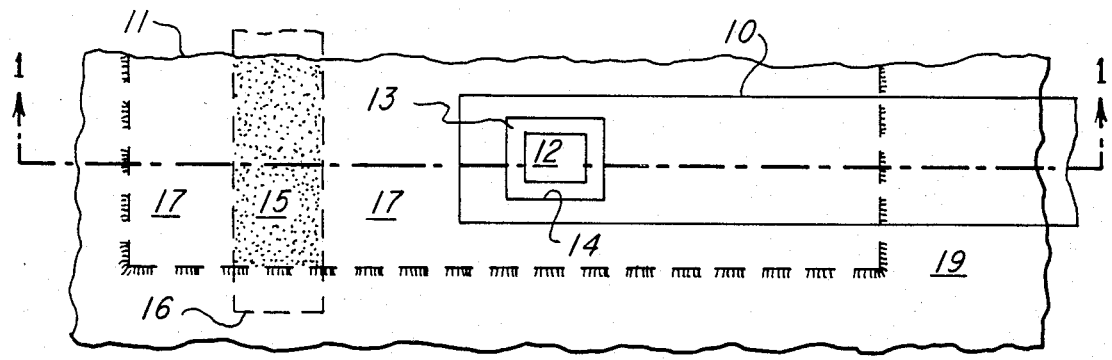
FIG. 2 is a plan view of the part of the chip of FIG. 1.

Referring to FIGS. 1 and 2, a metal-to-silicon contact made according to the invention consists of an aluminum strip 10 engaging a silicon bar 11 at a contact area 12, with aluminum sidewall segments 13 in an aperture 14 or at a step or discontinuity functioning to provide the desired thicker sidewalls. Typically, an MOS transistor 15 formed in the bar 11 includes a polysilicon gate 16, N+ source/drain regions 17, and thin gate oxide 18 as set forth in U.S. Pat. Nos. 4,055,444 or 4,240,092, assigned to Texas Instruments. Thick thermally-grown field oxide 19 surrounds the transistor 15 and contact area 12 of the face of the bar 11, and P+ channel-stop regions 20 underlie the field oxide. Low-temperature deposited oxide 21 covers the face of the bar to insulate the polycilicon 16 from the metal strips 10 at cross-over positions; usually a thinner layer 22 of thermal silicon oxide is grown beneath the deposited oxide 21.

Only a very small part of the silicon bar 11 is shown in FIG. 1 and 2. The bar would be a memory device as shown in U.S. Pat. Nos. 4,239,993 or 4,314,362, or a microcomputer device as shown in U.S. Pat. Nos. 4,074,351 or 3,991,305, all assigned to Texas Instruments, and so many thousands of transistors such as transistor 15 would be included. The device may employ double-level polysilicon as in U.S. Pat. No. 4,240,092, instead of only one level of polycrystalline silicon 16.

Figure 3A:
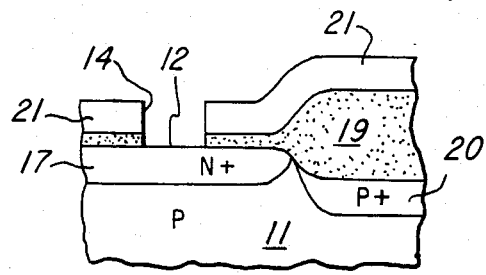
FIGS. 3a-3d are elevation views in section of the part of the chip corresponding to FIG. 1 at various stages in manufacture.
Figure 3B:
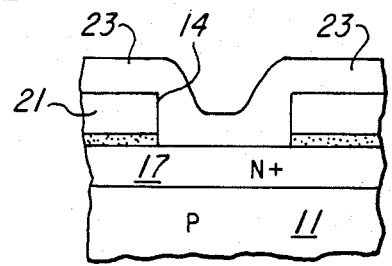
Figure 3C:
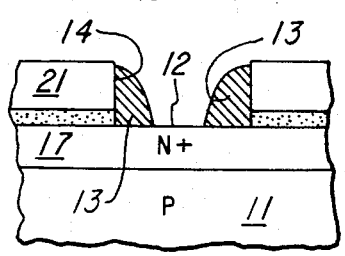

In FIGS. 3a-3d, a method of making the improved metal-to-silicon contacts is illustrated. FIG. 3a shows the bar 11 after the transistor 15 has been completed by a series of deposition, oxidation and impurity implant steps using photoresist masking, all as set forth in U.S. Pat. Nos. 4,055,444, 4,240,092, or 4,291,328. The thick oxide 21 has been deposited by conventional techniques, and the hole 14 has been etched using photoresist as a mask. The sidewalls of the hole 14 are nearly vertical, or in some cases may undercut, and the depth is perhaps 10,000 A or more so thinning or discontinuities could occur upon metallization. According to the invention, a two-step metal deposition sequence is used to enhance step coverage. As seen in FIG. 3b, a first layer 23 of metal is deposited by conventional techniques. Ordinarily this metal is aluminum or silicon-doped aluminum, although other metals such as molydenum, tungsten, or combinations could be used. The thickness of the layer 23 is about 10,000 A. Next an etch process is employed which is anisotropic or orientation-dependent; that is, material is removed vertically, but little is removed horizontally. A reactive ion etch, or various types of r.f. plasma etch as disclosed in U.S. Pat. No. 4,297,162 function in this manner. This etch process is terminated as soon as the horizontally-oriented parts have been etched through; for example, in a plasma etch reactor, a spectrum analyzer is employed to monitor the process, so the etch is terminated when a line indicating silicon oxide first occurs. The result is seen in FIG. 3c where the segments 13 remain after the layer 23 is removed from all horizontal surfaces, leaving metal on all vertical surfaces such as steps and sidewalls. The nature of the etch leaves the segments 13 sloping outward toward the bottom, so the step transistion is smoothed.

Figure 3D:
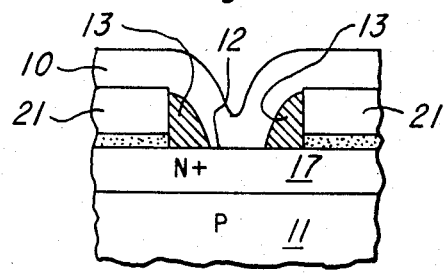

Turning now to FIGS. 3d, a second layer 10 of metal is deposited having a thickness about the same as the first. This layer 10 extends down into the aperture 14 to contact the silicon at the contact area 12. The segments 13 function to both increase the thickness at steps or sidewalls, and reduce the steepness. Yield and reliability are increased, and tolerances can be reduced for greater circuit density.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making contact to a face of a semiconductor body through an aperture in an insulating layer on said face, comprising the steps of:
   (a) depositing a layer of conductive material on said face to cover the semiconductor body within said aperture and also to cover the insulating layer and the sidewalls of the aperture,
   (b) selectively removing said layer of conductive material from said face over said insulating layer but leaving said layer in place on said sidewalls,
   (c) thereafter depositing additional conductive material on said face to extend continuously from above the insulator and down the sidewall into the aperture and to make physical and electrical contact to the semiconductor body in said aperture.

2. A method according to claim 1 wherein said conductive material is aluminum, the semiconductor is silicon, and the insulator includes silicon oxide.

3. A method according to claim 1 wherein the step of removing the layer of conductive material includes a vertical orientation-dependent etching.

4. A method of applying a conductive strip to a face of a body haing a vertical step, comprising the steps of:
   (a) depositing a layer of conductive material on said face to cover the body and the sidewall of the step,
   (b) selectively removing the layer of conductive material over all of said face by anisotropic etch but leaving a segment of the layer on the sidewall, and
   (c) thereafter depositing another layer of conductive material on all of said face to extend across the step and said segment making physical contact to said face.

5. A method according to claim 4 wherein the conductive material is metal.

6. A method according to claim 4 wherein the body is semiconductor.

7. A method according to claim 6 wherein the conductive material is aluminum.

8. A method of making a metal connection at a face of a semiconductor body. Said connection extending over a step in an insulating layer on said face, comprising the steps of:
   (a) depositing a layer of conductive material on said face to cover said face of the semiconductor body and to cover the insulating layer and the sidewall of the step,
   (b) selectively removing the layer of conductive material over said insulating layer but leaving the layer on said sidewall, and
   (c) thereafter depositing another layer of conductive material on said face to extend continuously across the step over the sidewall to physically engage said face of the body.

9. A method according to claim 8 wherein the conductive material is aluminum, the semiconductor is silicon, and the insulator includes silicon oxide.

10. A method according to claim 8 wherein the step of removing the layer of conductive material includes vertical anisotropic etching.

* * * * *

Notice of Adverse Decision in Interference

In Interference No. 101,570, involving Patent No. 4,507,853, J. M. McDavid, METALLIZATION PROCESS FOR INTEGRATED CIRCUITS, final judgment adverse to the patentee was rendered Sept. 9, 1986, as to claims 1-10.
[*Official Gazette December 2, 1986.*]